United States Patent [19]
LeBlanc

[11] Patent Number: 5,949,991
[45] Date of Patent: Sep. 7, 1999

[54] FAST MODELING OF SIGNAL PROPAGATION DELAYS THROUGH INTERCONNECT WIRES WITH ARBITRARY LOAD DISTRIBUTION

[75] Inventor: Marcel A. LeBlanc, Sunnyvale, Calif.

[73] Assignee: Altera Corporation, San Jose, Calif.

[21] Appl. No.: 08/940,248

[22] Filed: Sep. 30, 1997

Related U.S. Application Data

[60] Provisional application No. 60/028,035, Oct. 8, 1996.

[51] Int. Cl.⁶ ................................................. G06F 17/50
[52] U.S. Cl. ....................................................... 395/500.35
[58] Field of Search ............................. 395/500; 364/578, 364/489–491

[56] References Cited

U.S. PATENT DOCUMENTS

| | | | |
|---|---|---|---|
| 5,305,229 | 4/1994 | DhR | 364/490 |
| 5,381,354 | 1/1995 | Takegami et al. | 364/491 |
| 5,396,435 | 3/1995 | Ginetti | 364/489 |
| 5,500,808 | 3/1996 | Wang | 364/578 |

*Primary Examiner*—Kevin J. Teska
*Assistant Examiner*—Ayni Mohamed
*Attorney, Agent, or Firm*—Limbach & Limbach L.L.P.

[57] ABSTRACT

A method of analyzing a plurality of signal propagation delays along a plurality of signal interconnection lines within a programmable integrated circuit using a distributed electrical circuit model for the signal interconnection lines which programmably interconnect the electronic circuits forming the cooperative logic functions within the programmable integrated circuit. Load models representing such electronic circuits are incorporated into the circuit model for the signal interconnection lines, and differential nodal equations are generated in accordance with Kirchhoff's Current Law. The differential equations are converted to linear equations in which time is expressed in terms of a finite time interval, or time step. The linear equations are simplified by using substitution techniques for the common variables, thereby producing simplified linear nodal equations which can be collectively represented in a matrix format which includes a square quasi-diagonal coefficient matrix in which all elements more than one element away from the major diagonal thereof have a zero value. Such simplified linear nodal equations can be quickly and easily solved to compute the signal propagation delays along the signal interconnection lines, thereby facilitating any necessary redesign of such signal interconnection lines so as to reduce critical signal propagation delays.

9 Claims, 3 Drawing Sheets

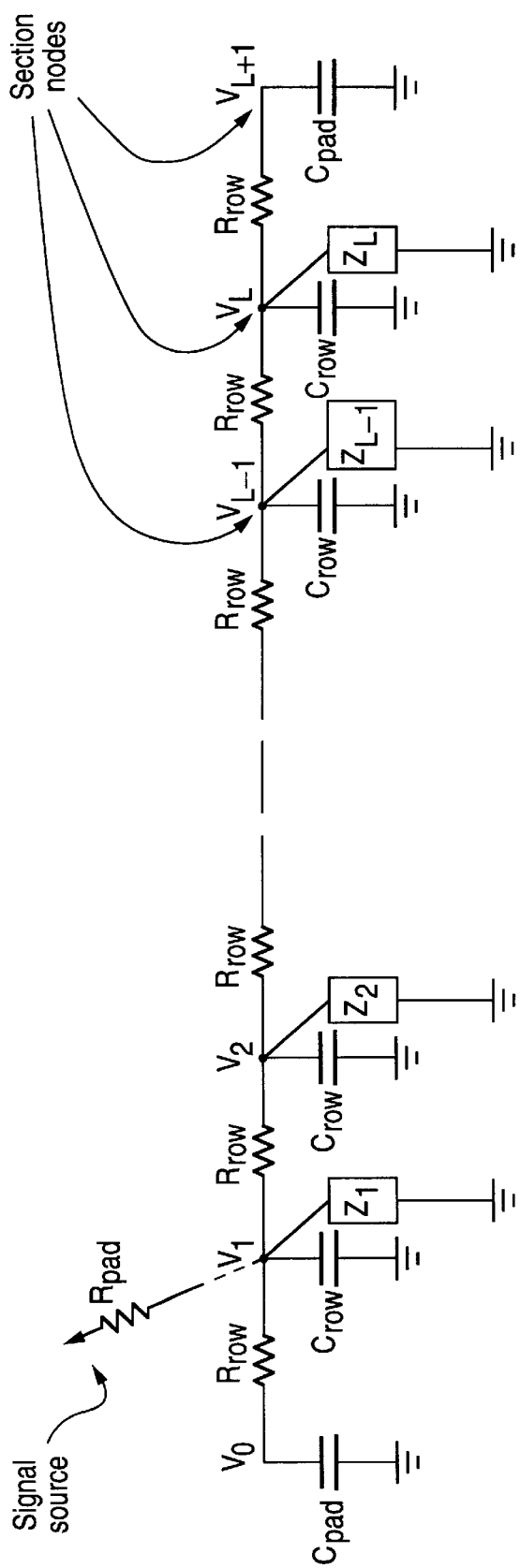
FIGURE 2
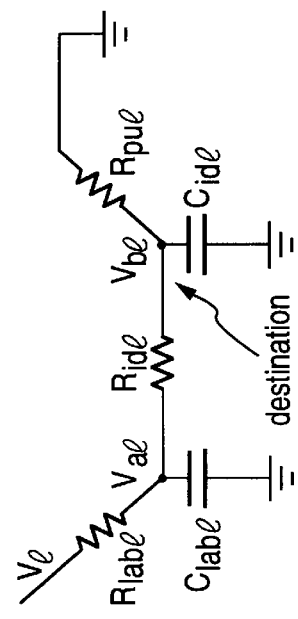
FIGURE 3C
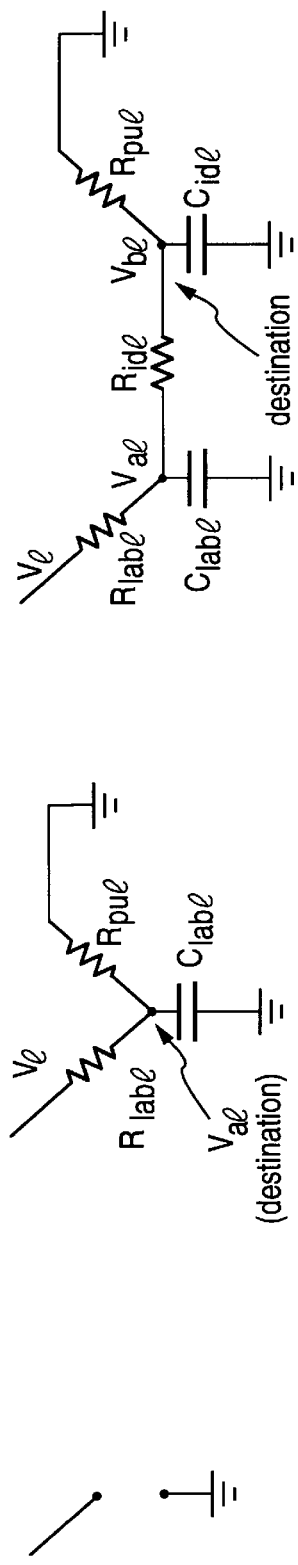
FIGURE 3B
FIGURE 3A

FAST MODELING OF SIGNAL PROPAGATION DELAYS THROUGH INTERCONNECT WIRES WITH ARBITRARY LOAD DISTRIBUTION

RELATED APPLICATIONS

This application claims the benefit of U.S. Provisional Application No. 60/028,035, filed Oct. 8, 1996, and entitled "Fast Modeling of Signal Propagation Delays Through Interconnect Wires With Arbitrary Load Distributions."

BACKGROUND OF THE INVENTION

1. Field of the Invention

The present invention relates to methods for modeling and analyzing signal propagation delays through interconnect wires having arbitrary load distributions, and in particular, to such methods which use an interconnect wire model with a network topology which allows an accurate analysis to be performed quickly with numerical analysis methods.

2. Description of the Related Art

Many types of integrated circuits, such as programmable logic devices ("PLDs"), contain many long metal "wires" that are used to carry signals throughout the chip. The point on one of these interconnect wires from which a signal originates is known as a signal "source" and each of the points to which the signal must be propagated is known as a signal "destination." The time it takes for a signal to propagate from its source to one of many possible destinations is known as the "interconnect propagation delay." For a given source and destination, the interconnect propagation delay can vary dramatically depending on the positions of the source and destination, as well as the positions of all other possible destinations for the given source (i.e., the loading on the interconnect wire). For example, some typical propagation delays vary from less than 1 nanosecond to 50 nanoseconds or more.

It is important to be able to accurately predict interconnect propagation delays so as to get an accurate estimate of the speed at which a design will operate. The large range over which interconnect propagation delays can vary makes the task of predicting these delays more difficult than for other internal device delays. Well known techniques such as those used in the SPICE electrical circuit simulator can accurately model (i.e., predict) propagation delays through circuits with up to a few thousand elements, but the computation time required to model these delays using the generalized techniques of time-domain electrical circuit simulation is unacceptably high.

SUMMARY OF THE INVENTION

In accordance with the present invention, interconnect propagation delays can be quickly predicted while also achieving the accuracy of SPICE-like time-domain electrical circuit simulation by using a model in the form of an electrical network consisting of only resistors and capacitors. Limiting the model to only resistors and capacitors, as well as using a network topology that permits only nearest neighbor connections, produces a circuit that can be analyzed quickly using numerical methods.

In accordance with one embodiment of the present invention, a method of analyzing a plurality of signal propagation delays along a plurality of signal interconnection lines within a programmable integrated circuit includes the steps of:

(a) mapping a plurality of interconnected cooperative logic functions into a programmable design for a programmable integrated circuit, wherein said programmable design includes a plurality of signal interconnection lines which programmably interconnect a plurality of electronic circuits within said programmable integrated circuit;

(b) generating a plurality of signal interconnection line data which represent said plurality of signal interconnection lines;

(c) mapping said plurality of signal interconnection line data into a distributed electrical circuit model which includes a plurality of impedance elements interconnected as a plurality of serial and shunt impedance elements via a plurality of circuit model nodes;

(d) generating a plurality of load data which represent corresponding ones of said plurality of electronic circuits;

(e) mapping said plurality of load data into a corresponding plurality of load models;

(f) incorporating said plurality of load models into said distributed electrical circuit model as a plurality of additional shunt impedance elements which are connected to respective ones of said plurality of circuit model nodes;

(g) generating a plurality of nodal equations which define, in terms of a finite time interval, a corresponding plurality of relationships among a plurality of electrical currents which flow into and out of corresponding ones of said plurality of circuit model nodes;

(h) manipulating a plurality of common variables within said plurality of nodal equations and in accordance therewith generating a plurality of simplified nodal equations which can be collectively represented in a matrix format which includes a square quasi-diagonal coefficient matrix in which all elements more than one element away from a major diagonal thereof have a zero value; and (i) solving said plurality of simplified nodal equations and in accordance therewith computing a plurality of signal propagation delays along said plurality of signal interconnection lines.

In accordance with another embodiment of the present invention, a program storage device which is readable by a machine and tangibly embodies a program of instructions which are executable by such machine to perform method steps for analyzing a plurality of signal propagation delays along a plurality of signal interconnection lines within a programmable integrated circuit contains a program of instructions which include the aforementioned method steps (a) through (i).

In accordance with still another embodiment of the present invention, a computer programmed to analyze a plurality of signal propagation delays along a plurality of signal interconnection lines within a programmable integrated circuit is programmed to perform the aforementioned method steps (a) through (i).

These and other features and advantages of the present invention will be understood upon consideration of the following detailed description of the invention and the accompanying drawings.

BRIEF DESCRIPTION OF THE DRAWINGS

FIG. 2 is a schematic diagram of a distributed electrical circuit model in the form of a regular ladder network of resistors and capacitors along with arbitrary load models attached thereto to simulate the positions of various loads on the interconnect wire for signal propagation delay modeling and analysis in accordance with one embodiment of the present invention.

FIG. 3 contains schematic diagrams of no load model, a first order load model and a second order load model for use with the distributed electrical circuit model of FIG. 2.

DETAILED DESCRIPTION OF THE INVENTION

Figure 1:
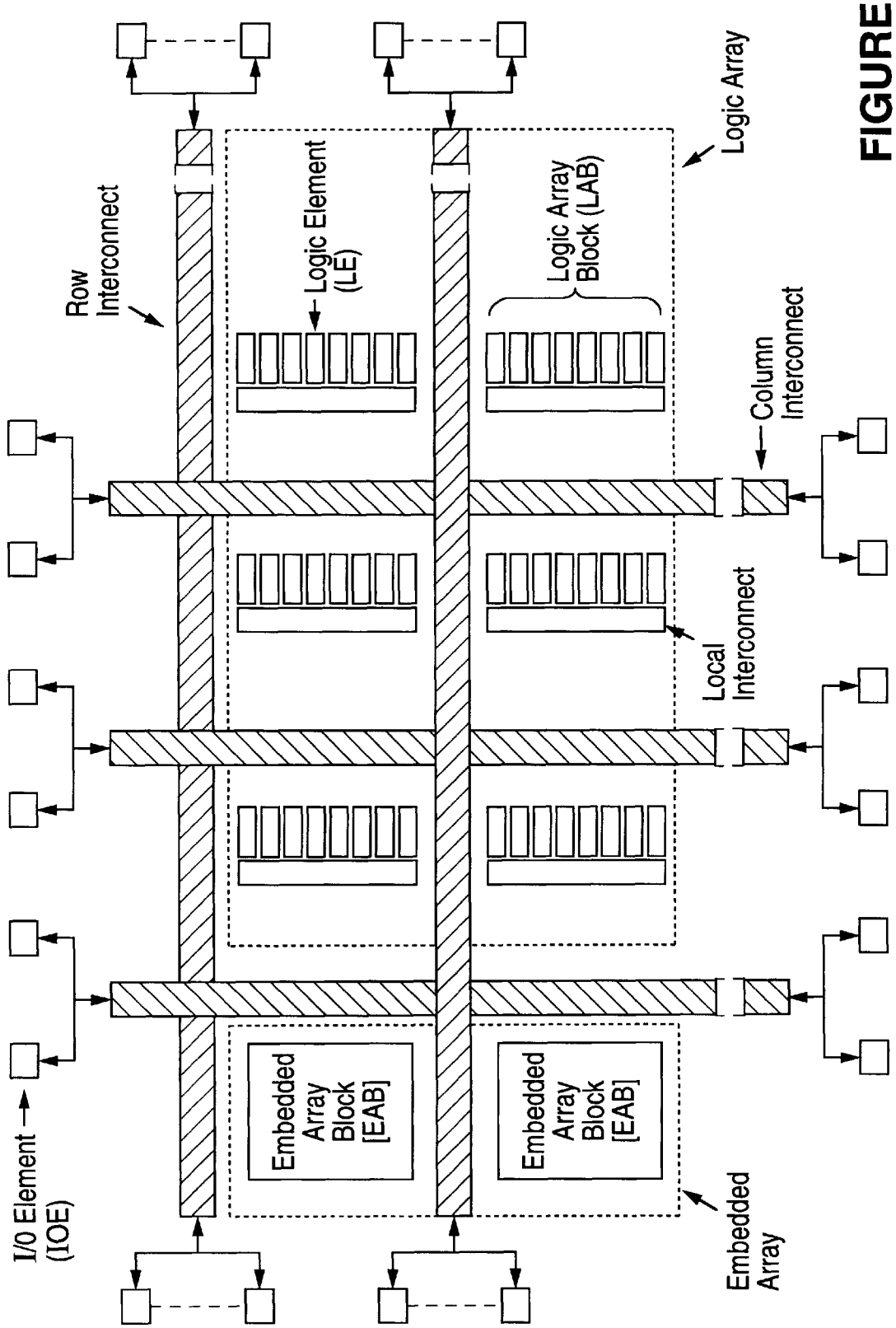
FIG. 1 is a functional block diagram of a representative programmable logic device for which signal propagation delay modeling and analysis in accordance with the present invention is particularly advantageous.

Referring to FIG. 1, a programmable logic device for which signal propagation delay modeling and analysis in accordance with the present invention is particularly advantageous includes embedded array blocks of logic ("EABs") as well as multiple logic array blocks ("LABs"). Each LAB includes multiple logic elements ("LEs") which are selectively interconnected to one another via local interconnect lines. In turn, each of the LABs is selectively interconnected to one or more other LABs via row, or global horizontal ("GH"), interconnect lines and column, or global vertical ("GV"), interconnect lines. In accordance with well known techniques, such interconnections are programmed using programmable switches (e.g., pass transistors) at: intersections of the LEs and their associated local interconnect lines; intersections of local interconnect lines and row interconnect lines; intersections of local interconnect lines and column interconnect lines; and intersections of row and column interconnect lines.

The new technique models interconnect wires with arbitrary load distributions as an electrical circuit with a flexible structure of varying size and configuration. A regular ladder network of resistors and capacitors models the interconnect wire itself (the wire model), but arbitrary load models can be attached to the wire model at any point to simulate the positions of various loads on the interconnect wire. The wire model is shown in FIG. 2. The load models, labeled $Z_l$ in FIG. 2, are shown in more detail in FIG. 3. Each load model $Z_l$ represents the interconnections matrix up to a signal buffer.

The interconnect model shown in FIG. 2 consists of L load sections, each with a $C_{row}$ and a $Z_l$ and two termination sections ($C_{pad}$). When modeling a GH line, each load section corresponds to one LAB. The signal source (a step function) is connected to the top of $R_{pad}$ which represents the programmable switch (e.g., pass transistor) connecting the source to the signal path. The floating end of $R_{pad}$ drives either a load section node or a termination section node, depending on the position of the source that is being modeled.

Referring to FIG. 3, load model (A) is for use with those nodes which have no load. Load model (B) is a first order load model for buffered loads, e.g., where one pass transistor is used to provide the interconnection. Load model (C) is a second order load model for unbuffered LAB loads and includes the propagation delay through the LAB local interconnect lines, e.g., where two or more pass transistors are used to provide the interconnections.

Modeling the RC network to calculate interconnect propagation delays first requires a set of nodal equations that completely describe the network. The load section to which the signal source is connected has slightly different nodal equations, because the signal source drives the section node through the resistor $R_{pad}$.

Termination sections, section 0 and section L+1, are connected to only one other load section. Section 0 is connected only to load section 1, and section L+1 is connected only to load section L.

TABLE 1

| | not the signal source | signal source |
|---|---|---|
| Termination section 0 | $Cpad \dfrac{dV0}{dt} + \dfrac{V0 - V1}{Rrow} = 0$ | $Cpad \dfrac{dV0}{dt} + \dfrac{V0 - V1}{Rrow} + \dfrac{V0 - Vdd}{Rpad} = 0$ |
| Termination section L + 1 | $\dfrac{VL+1 - VL}{Rrow} + Cpad \dfrac{dVL+1}{dt} = 0$ | $\dfrac{VL+1 - VL}{Rrow} + Cpad \dfrac{dVL+1}{dt} + \dfrac{VL+1 - Vdd}{Rpad} = 0$ |

Load sections, sections 1 through L have different equations depending on the load model that is used as well as the position of the source.

TABLE 2

| | not the signal source | signal source |
|---|---|---|
| Load section/ with no load | $\dfrac{Vl - Vl-1}{Rrow} + Crow \dfrac{dVl}{dt} + \dfrac{Vl - Vl+1}{Rrow} = 0$ | $\dfrac{Vl - Vl-1}{Rrow} + Crow \dfrac{dVl}{dt} + \dfrac{Vl - Vl+1}{Rrow} + \dfrac{Vl - Vdd}{Rpad} = 0$ |

TABLE 2-continued

| | not the signal source | signal source |
|---|---|---|
| Load section/ with load | $\dfrac{Vl - Vl - 1}{Rrow} + Crow\dfrac{dVl}{dt} + \dfrac{Vl - Val}{Rlabl} + \dfrac{Vl - Vl + 1}{Rrow} = 0$ | $\dfrac{Vl - Vl - 1}{Rrow} + Crow\dfrac{dVl}{dt} + \dfrac{Vl - Val}{Rlabl} + \dfrac{Vl - Vl + 1}{Rrow} + \dfrac{Vl - Vdd}{Rpad} = 0$ |

Each load type other than the "no load" type requires additional nodal equations to complete the description of the circuit.

TABLE 3

| | Extra nodel equation(s) to describe the load type |
|---|---|
| first order load | $\dfrac{Val - Vl}{Rlabl} + Clabl\dfrac{dVal}{dt} + \dfrac{Val}{Rpul} = 0$ |
| second order load | $\dfrac{Val - Vl}{Rlabl} + Clabl\dfrac{dVal}{dt} + \dfrac{Val - Vbl}{Rldl} = 0,$ and $\dfrac{Vbl - Val}{Rldl} + Cldl\dfrac{dVbl}{dt} + \dfrac{Vbl}{Rpul} = 0$ |

In order to avoid requiring computationally difficult time domain simulations of the entire resulting network as a whole, various techniques are used to simplify the network such that it can be solved as many nearly separate, smaller circuits. For these techniques to work, the RC network must obey the following rules:

Rule 1. The structure of the wire model is fixed, except that it can have any number of sections.

Rule 2. Any number of different load models can be created and connected to the wire model to simulate different types of interconnect wires and loads, but each load model must have a fixed structure.

Rule 3. Load models can only be connected to the wire model; never to each other and never more than one per wire model section.

The goal of these rules is to simplify the RC network such that the set of nodal equations that describe it can be solved with computation time that is proportional to the number of wire model load sections, L. This is also known as computational complexity O(n). The wire model, with no loads, already meets this requirement. Special manipulation of the load models allows them to be absorbed into the wire model.

Load models can be arbitrarily complicated. As long as they only interact with the wire model and not with each other, they can be solved separately and absorbed into the wire model nodal equations. The fixed structure allows the load model circuit and its effects on the wire model to be solved in advance (symbolically, by hand) and its solution to be entered directly in the program source code. The goal of this manipulation is to eliminate any reference to $V_{al}$ from the wire model nodal equations. The elimination of $V_{al}$ is done through symbolic algebraic manipulations (discussed in more detail below) after the dV/dt terms have been removed from the equations. Once the $V_{al}$ references have been eliminated, the wire model nodal equations will use only section node voltages as variables, i.e., $V_l$ with l in the range of 0 to L+1.

The effects of the load model on the wire model are calculated during the simulation of the wire model without significantly increasing the computation required to simulate the time domain behavior of the wire model. The wire model, with its pre-solved loads, remains simple enough that it can be solved with two passes through multiple single-dimensional arrays, rather than requiring multiple passes through two-dimensional arrays as would be required for classical circuit simulation (i.e., the coefficients form a quasi-diagonal matrix).

Following the rules given above still gives the RC network enough flexibility to model virtually all routing element types. The RC network is customized by specifying the number of wire model load sections, L, as well as values for the resistors and capacitors used in the network.

Current software implementations of the RC interconnect model can predict timing delays for many routing elements. The function that implements the model requires many parameters to describe the RC network. Most of the names used for the various parameters show that the model was initially developed to predict GH timing. This is appropriate because predicting propagation delays on GH lines is often the most challenging timing prediction problem encountered. The RC interconnect model can also handle timing predictions for simpler routing elements.

The following list of parameters must be used to describe the RC network:

TABLE 4

| Parameter | Description |
|---|---|
| $R_{pad}$ | output resistance of the step function source |
| $C_{pad}$ | capacitance of the termination sections, typically $C_{row}/2$ |
| $R_{row}$ | wire resistance between sections, typically $< 1\ \Omega$ |
| $C_{row}$ | capacitance of load sections that have no loads |
| L | total number of load sections in the RC network |
| source_position | section number of the step function source |
| nl for l = 1, . . . , L | number of unbuffered loads in each of the L load sections (for buffered load sections, use nl = 1) |
| load_type | specifies first order or second order load type |
| $R_{load}$ | varies, but usually the "on" resistance of the pass gate that drives one load (e.g., a LUT input) |

TABLE 4-continued

| Parameter | Description |
| --- | --- |
| $C_{load}$ | varies, but usually the diffusion capacitance of the pass gate that drives one load + the gate capacitance of the load (e.g., a LUT input) |
| $R_{lab0}$ | resistance of the first level multiplexor structure that connects the wire (GH, GV, etc . . . ) to the second level multiplexor structure or to the buffered load |
| $C_{lab0}$ | capacitance associated with the $R_{lab0}$ structure |
| $R_{pu}$ | resistance of the pull-up at each load (for no pull-up, use something like $10^7$ Ω) |
| include_local | if TRUE, the destination is inside the load model, otherwise it is the section node |
| destination list | a list of destination sections for which propagation delays must be calculated (values in the list must be within the range of 0 to L + 1) |

For load models, $n_l$ is the number of unbuffered loads in load section l (e.g., $n_l$LUT inputs in LAB 1 driven by a GH line). If the wire that is being modeled drives only buffered loads, then select a value of either 0 or 1 for $n_l$ depending on the quality of the buffer, and use the simpler first order load type. Regardless of load type, an open circuit is used to model sections with zero loads. For load sections with $n_l>0$, either a first order or a second order load model can be used.

The propagation delay is defined as the time needed for the voltage at the destination node to reach half of the source voltage. The node corresponding to the destination depends on the include_local setting and the load model that is being used. For include_local=0, the destination is the section node of the appropriate section. Normally, include_local will be 1, and the destination depends on the load model.

The parameters are used to calculate the load model elements $R_{labl}$ $C_{labl}$ $R_{ldl}$ $C_{ldl}$ and $R_{pul}$ as follows:

| first order load type | second order load type |
| --- | --- |
| $R_{labl} = R_{lab0} + R_{load}/nl$ | $R_{labl} = R_{lab0}$ |
| $C_{labl} = C_{lab0} + C_{load}/nl$ | $C_{labl} = C_{lab0}$ |
|  | $R_{ldl} = R_{load}/nl$ |
|  | $C_{ldl} = C_{load}/nl$ |
| For both load types, $R_{pul} = R_{pu}/nl$ | |

In principle, a solution to the collection of nodal equations discussed above is possible, but the presence of the dV/dt terms makes the effort required to produce exact solutions too high for most applications. On the other hand, generating solutions using numerical approximations is much easier. Electrical circuit analysis software, such as the popular SPICE program, commonly uses numerical approximation techniques to analyze the time domain behavior of circuits. The approximations can be very accurate if necessary, but this accuracy is usually gained at the expense of greater computation time.

The presence of the term dV/dt makes the nodal equations differential equations. This term can be approximated as ΔV/Δt, where Δt is a finite time interval (the time step), and ΔV is the change in voltage over the time step. Smaller time step values produce more accurate solutions at the expense of greater computation time. As a result of this approximation, the nodal equations become linear equations, which are easily solved at each time step using numerical techniques such as Gaussian Elimination.

Given a set of known node voltages for all nodes in the RC network, the time step method allows us to calculate the node voltage changes, ΔV, during the time step interval for all nodes. The node voltage changes can then be added to the known node voltages from the beginning of the time step to give the node voltages for the beginning of the next time step, i.e., $V^{i+1}=V^i+\Delta V^i$. The method can be repeated until all the destination node voltages reach or exceed $V_{dd}/2$, the voltage at which the signal is considered to have "arrived" at the destination. The time needed for this voltage level to be reached at a destination is the signal propagation delay for that destination.

Calculating the approximate current through a capacitor, I=CΔV/Δt, is simplified as a result of the time step approximation. Unfortunately this approximation introduces small errors in the calculation of the node voltage changes, ΔV, at each time step because the current through the capacitor changes during the time step. These errors are cumulative, and must be minimized to produce acceptable results. For electrical networks of more that a few nodes, it is not acceptable to use capacitor currents from either the beginning of a time step (forward-Euler) or the end of a time step (backward-Euler) as an approximation of the current during a time step. It is much better to use the average of the currents at the beginning and at the end of a time step (trapezoidal integration) to approximate the current through a capacitor during a time step.

Using trapezoidal integration, we resolve the integral $$\Delta V = \frac{1}{C}\int_{t^i}^{t^{i+1}} I \cdot dt,$$

with the approximate result $$\Delta V = \frac{1}{C}\left(\frac{I^i + I^{i+1}}{2}\right)\Delta t,$$

and rearrange the result as capacitor:

$$I^i + I^{i+1} = 2C\frac{\Delta V}{\Delta t}.$$

Figure 4:
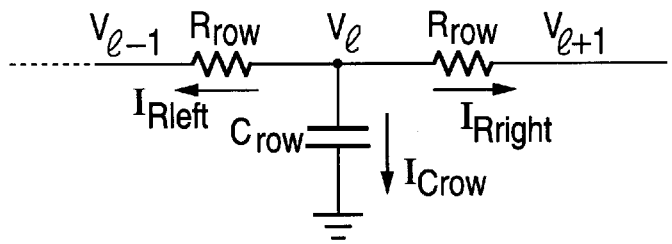
FIG. 4 is a schematic diagram illustrating the nodal currents at one of the section nodes of the distributed electrical circuit model of FIG. 2.

Making use of this result requires that we write nodal equations that sum the currents from both the beginning of a time step and the end of that time step. For example, consider the section node shown on FIG. 4. At the beginning of time step i, we can write $I_{Crow}^i+I_{Rleft}^i+I_{Rright}^i=0$, and at the beginning of time step i+1, we can write $I_{Rleft}^{i+1}+I_{Rright}^{i+1}+I_{Crow}^{i+1}=0$. To make use of the capacitor current trapezoidal integration result, we must add these two equations to get $I_{Crow}^i+I_{Crow}^{i+1}+I_{Rleft}^i+I_{Rleft}^{i+1}+I_{Rright}^i+I_{Rright}^{i+1}=0$. As shown above, the term $I_{Crow}^i+I_{Crow}^{i+1}$ can be replaced by $2C_{row}\Delta V_l^i/\Delta t$.

The resistor currents are easily calculated without any need for approximations. The current through the left $R_{row}$ at the beginning of time step i, is $I_{Rleft}^i=(V_1^i-V_1-1^i)/R_{row}$. To make the nodal equation refer only to voltages from the time step i, we choose to write $V_l^{i+1}$ as $V_l^i + \Delta V_l^i$. At the end of time step i, the current through the left $R_{row}$ is $((V_l^i + \Delta V_l^i) - (V_{l-1}^i + \Delta V_{l-1}^i))/R_{row}$. To create the final time step nodal equation for an unloaded section l, we expand the equation $I_{Crow}^i + I_{Crow}^{i+1} + I_{Rleft}^i + I_{Rleft}^{i+1} + I_{Rright}^i + I_{Rright}^{i+1} = 0$ as follows:

$$2 Crow \frac{\Delta V_l^i}{\Delta t} + \frac{V_l^i - V_{l-1}^i}{Rrow} + \frac{V_l^i + \Delta V_l^i - V_{l-1}^i - \Delta V_{l-1}^i}{Rrow} +$$

$$\frac{V_l^i - V_{l+1}^i}{Rrow} + \frac{V_l^i + \Delta V_l^i - V_{l+1}^i - \Delta V_{l+1}^i}{Rrow} = 0$$

This equation is equivalent to the equation given in Table 5 for an unloaded section that is not the signal source. The unknown values in this equation and the equations given in the next sections are the $\Delta V^i$. The $V^i$ are treated as known constants because they were calculated from the results of the previous time step (or were assigned a value of 0 at time t=0).

Using trapezoidal integration of capacitor currents over finite time steps results in a set of linear equations that can be easily and quickly solved. The following are the equations from the discussion above restated as time step equations. They have been slightly reorganized to group variables on one side of the equal sign and constants on the other. This form is more convenient for matrix representation and to demonstrate the techniques of variable elimination.

The equations for unloaded sections given in Table 5 can be used directly in the program source code.

Loaded section equations will have references to $V_{al}$ and $\Delta V_{al}$. References to $V_{al}$ are allowed because all node voltage are known at the beginning of each time step, but references to the unknown values $\Delta V_{al}$ must be removed. The technique used to generate the equations of Table 5 yields the following nodal equation at $V_l$ when $V_l$ is not the signal source:

$$\left(-\frac{1}{R_{row}}\right)\Delta V_{l-1_i} + \left(C_{row}\frac{2}{\Delta t} + \frac{2}{R_{row}} + \frac{1}{R_{labl}}\right)\Delta V_l^i + \left(-\frac{1}{R_{row}}\right)\Delta V_{l+1}^i + \quad \text{eq. N}$$

$$\left(-\frac{1}{R_{labl}}\right)\Delta V_{al}^i = 2\frac{V_{l-1}^i - V_l^i}{R_{row}} + 2\frac{V_{l-1}^i - V_l^i}{R_{row}} + 2\frac{V_{al}^i - V_l^i}{R_{labl}}$$

For a first order load, the equation at node $V_{al}$ is:

$$\left(-\frac{1}{Rlabl}\right)\Delta V_l^i + \left(Clabl\frac{2}{\Delta t} + \frac{1}{Rlabl} + \frac{1}{Rpul}\right)\Delta V_{al}^i = \quad \text{eq. A}$$

$$2\frac{V_l^i - V_{al}^i}{Rlabl} - 2\frac{V_{al}^i}{Rpul}$$

To eliminate the $\Delta V_{al}$ term from eq. N, we must multiply eq. A by an appropriate constant, $k_1$, then add it to eq. N. Our final time step nodal equation for load sections with first order loads will be the equation that results from the manipulation (eq. N)+$k_1$(eq. A). Since we want to eliminate $\Delta V_{al}$ from the final equation, we must choose the following value for $k_1$:

TABLE 5

Time step nodal equations for unloaded sections

| | Time step nodal equation |
|---|---|
| Termination section 0, not the signal source | $\left(Cpad\frac{2}{\Delta t} + \frac{1}{Rrow}\right)\Delta V_0^i + \left(-\frac{1}{Rrow}\right)\Delta V_1^i = 2\frac{V_1^i - V_0^i}{Rrow}$ |
| Termination section 0, signal source | $\left(Cpad\frac{2}{\Delta t} + \frac{1}{Rrow} + \frac{1}{Rpad}\right)\Delta V_0^i + \left(-\frac{1}{Rrow}\right)\Delta V_1^i = 2\frac{V_1^i - V_0^i}{Rrow} + 2\frac{V_{dd} - V_0^i}{Rpad}$ |
| Termination section L + 1, not the signal source | $\left(-\frac{1}{Rrow}\right)\Delta V_L^i + \left(Cpad\frac{2}{\Delta t} + \frac{1}{Rrow}\right)\Delta V_{L+1}^i = 2\frac{V_L^i - V_{L+1}^i}{Rrow}$ |
| Termination section L + 1, signal source | $\left(-\frac{1}{Rrow}\right)\Delta V_L^i + \left(Cpad\frac{2}{\Delta t} + \frac{1}{Rrow} + \frac{1}{Rpad}\right)\Delta V_{L+1}^i = 2\frac{V_L^i - V_{L+1}^i}{Rrow} + 2\frac{V_{dd} - V_{L+1}^i}{Rpad}$ |
| Load section, 0 loads, not the signal source | $\left(-\frac{1}{R_{row}}\right)\Delta V_{l-1}^i + \left(C_{row}\frac{2}{\Delta t} + \frac{2}{R_{row}}\right)\Delta V_l^i + \left(-\frac{1}{R_{row}}\right)\Delta V_{l+1}^i = 2\frac{V_{l-1}^i - V_l^i}{R_{row}} + 2\frac{V_{l+1}^i - V_l^i}{R_{row}}$ |
| Load section, 0 loads, signal source | $\left(-\frac{1}{R_{row}}\right)\Delta V_{l-1}^i + \left(C_{row}\frac{2}{\Delta t} + \frac{2}{R_{row}} + \frac{1}{R_{pad}}\right)\Delta V_l^i + \left(-\frac{1}{R_{row}}\right)\Delta V_{l+1}^i = 2\frac{V_{l-1}^i - V_l^i}{R_{row}} + 2\frac{V_{l+1}^i - V_l^i}{R_{row}} + 2\frac{V_{dd} - V_l^i}{R_{pad}}$ |

$$k_{1l} = \frac{1}{Rlabl\left(Clabl\frac{2}{\Delta t} + \frac{1}{Rlabl} + \frac{1}{Rpul}\right)}$$

Applying the manipulation (eq. N)+$k_1$(eq. A) yields the final time step nodal equation for a first order load section that is not connected to the source:

TABLE 6

Time step nodal equations for first order load sections

| | Time step nodal equation |
|---|---|
| first order load section, not the signal source (eq. N) + $k_1$(eq. A) | $\left(-\frac{1}{R_{row}}\right)\Delta V_{l-1}^i + \left(C_{row}\frac{2}{\Delta t} + \frac{2}{R_{row}} + \frac{1-k_{11}}{R_{labl}}\right)\Delta V_l^i + \left(-\frac{1}{R_{row}}\right)\Delta V_{l+1}^i =$ $2\frac{V_{l-1}^i - V_l^i}{R_{row}} + 2\frac{V_{l+1}^i - V_l^i}{R_{row}} + (2-2k_{11})\frac{V_{al}^i - V_l^i}{R_{labl}} - 2k_{11}\frac{V_{al}^i}{R_{pul}}$ |
| first order load section, signal source | $\left(-\frac{1}{R_{row}}\right)\Delta V_{l-1}^i + \left(C_{row}\frac{2}{\Delta t} + \frac{2}{R_{row}} + \frac{1}{R_{pad}} + \frac{1-k_{11}}{R_{labl}}\right)\Delta V_l^i + \left(-\frac{1}{R_{row}}\right)\Delta V_{l+1}^i =$ $2\frac{V_{l-1}^i - V_l^i}{R_{row}} + 2\frac{V_{l+1}^i - V_l^i}{R_{row}} + 2\frac{V_{dd} - V_l^i}{R_{pad}} + (2-2k_{11})\frac{V_{al}^i - V_l^i}{R_{labl}} - 2k_{11}\frac{V_{al}^i}{R_{pul}}$ |

Table 6 also shows the time step equation for a first order load section that is connected to a source. As usual, this equation differs from the no source version only in the addition of $R_{pad}$ terms. At each time step, after the $\Delta V_l^i$ are known, eq. A can be used to calculate the $\Delta V_{al}^i$ in first order load sections.

For a second order load, the equation at node $V_{al}$ is:

$$\left(-\frac{1}{Rlabl}\right)\Delta V_l^i + \left(Clabl\frac{2}{\Delta t} + \frac{1}{Rlabl} + \frac{1}{Rldl}\right)\Delta V_{al}^i + \left(-\frac{1}{Rlabl}\right)\Delta V_{bl}^i = 2\frac{V_l^i - V_{al}^i}{Rlabl} + 2\frac{V_{bl}^i - V_{al}^i}{Rldl} \quad \text{eq. A2}$$

and the equation at node $V_{b1}$ is:

$$\left(-\frac{1}{Rlabl}\right)\Delta V_{al}^i + \left(Cldl\frac{2}{\Delta t} + \frac{1}{Rldl} + \frac{1}{Rpul}\right)\Delta V_{bl}^i = 2\frac{V_{al}^i - V_{bl}^i}{Rldl} - 2\frac{V_{bl}^i}{Rpul} \quad \text{eq. B2}$$

Using the same variable elimination technique that we used for first order load equations, we must eliminate $\Delta V_{al}^i$ from the wire model load section nodal equation (eq. N). The second order load is more complicated, and introduced two new variables, $\Delta V_{al}^i$ and $\Delta V_{bl}^i$. First, we eliminate $\Delta V_{b1}^i$ from eq. A2 by multiplying eq. B2 by $k_{22}$ then adding the result to eq. A2.

$$k_{22l} = \frac{1}{Rldl\left(Cldl\frac{2}{\Delta t} + \frac{1}{Rldl} + \frac{1}{Rpul}\right)}$$

The manipulation (eq. A2)+$k_{22}$(eq. B2) yields eq. B:

$$\left(-\frac{1}{R_{labl}}\right)\Delta V_l^i + \left(C_{labl}\frac{2}{\Delta t} + \frac{1}{R_{labl}} + \frac{1-k_{22l}}{R_{1dl}}\right)\Delta V_{al}^i = 2\frac{V_l^i - V_{al}^i}{R_{labl}} + (2-2k_{22l})\frac{V_{bl}^i - V_{al}^i}{R_{1dl}} - 2k_{22l}\frac{V_{bl}^i}{R_{pul}} \quad \text{eq. B}$$

Next, we eliminate $\Delta V_{al}^i$ from eq. N by multiplying eq. B by $k_2$ then adding the result to eq. N.

$$k_{2l} = \frac{1}{R_{labl}\left(C_{labl}\frac{2}{\Delta t} + \frac{1}{R_{labl}} + \frac{1-k_{22l}}{R_{1dl}}\right)}$$

The manipulation (eq. N)+$k_2$(eq. B) yields the final second order load section equation:

TABLE 7

Time step nodal equations for second order load sections

| | Time step nodal equation |
|---|---|
| second order load section, not the signal source (eq. N) + $k_2$(eq. B) | $\left(-\dfrac{1}{R_{row}}\right)\Delta V_{l-1}^i + \left(C_{row}\dfrac{2}{\Delta t} + \dfrac{2}{R_{row}} + \dfrac{1-k_{21}}{R_{labl}}\right)\Delta V_l^i + \left(-\dfrac{1}{R_{row}}\right)\Delta V_{l+1}^i =$ $2\dfrac{V_{l-1}^i - V_l^i}{R_{row}} + 2\dfrac{V_{l+1}^i - V_l^i}{R_{row}} + (2-2k_{21})\dfrac{V_{al}^i - V_l^i}{R_{labl}} +$ $k_{21}\left[\dfrac{2-2k_{221}}{R_{1dl}}(V_{bl}^i - V_{al}^i) - 2k_{221}\dfrac{V_{bl}^i}{R_{pul}}\right]$ |
| second order load section, signal source | $\left(-\dfrac{1}{R_{row}}\right)\Delta V_{l-1}^i + \left(C_{row}\dfrac{2}{\Delta t} + \dfrac{2}{R_{row}} + \dfrac{1}{R_{pad}} + \dfrac{1-k_{21}}{R_{labl}}\right)\Delta V_l^i + \left(-\dfrac{1}{R_{row}}\right)\Delta V_{l+1}^i =$ $2\dfrac{V_{l-1}^i - V_l^i}{R_{row}} + 2\dfrac{V_{l+1}^i - V_l^i}{R_{row}} + 2\dfrac{V_{dd} - V_l^i}{R_{pad}} + (2-2k_{21})\dfrac{V_{al}^i - V_l^i}{R_{labl}} +$ $k_{21}\left[\dfrac{2-2k_{221}}{R_{1dl}}(V_{bl}^i - V_{al}^i) - 2k_{221}\dfrac{V_{bl}^i}{R_{pul}}\right]$ |

Table 7 also shows the equation for a second order load section that is connected to a source. This equation differs from the no source version only in the addition of $R_{pad}$ terms. At each time step, after the $\Delta V_l^i$ are known, eq. B can be used to calculate the $\Delta V_{al}^i$, and eq. B2 can be used to calculate the $\Delta V_{bl}^i$.

The linear equations given in Tables 5, 6 and 7 are easy to solve because each equation has at most three unknowns, $\Delta V_{l-1}^i$, $\Delta V_l^i$, and $\Delta V_{l-1}^i$. For example, a wire model with six load sections (eight total sections including the termination sections) would have nodal equations of the following form:

$$a_{00}\Delta V_0 + a_{01}\Delta V_1 = c_0$$
$$a_{10}\Delta V_0 + a_{11}\Delta V_1 + a_{12}\Delta V_2 = c_1$$
$$a_{21}\Delta V_1 + a_{22}\Delta V_2 + a_{23}\Delta V_3 = c_2$$
$$a_{32}\Delta V_2 + a_{33}\Delta V_3 + a_{34}\Delta V_4 = c_3$$
$$a_{43}\Delta V_3 + a_{44}\Delta V_4 + a_{45}\Delta V_5 = c_4$$
$$a_{54}\Delta V_4 + a_{55}\Delta V_5 + a_{56}\Delta V_6 = c_5$$
$$a_{65}\Delta V_5 + a_{66}\Delta V_6 + a_{67}\Delta V_7 = c_6$$
$$a_{76}\Delta V_6 + a_{77}\Delta V_7 = c_7$$

If the example equations were written in matrix form, we would say that the coefficient matrix A is quasi-diagonal. Variables are eliminated from equations using the same technique shown in the generation of time step nodal equations for loaded sections.

Starting from the section 1 equation, $\alpha_{10}\Delta V_0 + \alpha_{11}\Delta V_1 + \alpha_{12}\Delta V_2 = c_1$, we can eliminate the unknown $\Delta V_0$ using the equation from section 0. Multiply the equation from section 0 by $\alpha_{10}/\alpha_{00}$ then subtract the product from the section 1 equation. Repeating this technique for the equations from sections 2 through 7 reduces the equations to at most two unknowns, and yields an answer for the variable $\Delta V_7$. This value can then be used in the equation from section 6 to yield an answer for $\Delta V_6$. Once again, repeating this technique for the equations from sections 5 through 0 gives us values for all the $\Delta V$.

Because of the quasi-diagonal form of the $\Delta V$ coefficients, we are able to solve for all the $\Delta V$ in just two passes through the equations at each time step. Also, the $\Delta V$ coefficients can easily be stored in one-dimensional arrays, rather than requiring a two-dimensional matrix.

Floating point errors result from the finite precision available to computers to represent real numbers. For example, changing the order of a computation can give slightly different answers when real number precision is finite. The different results are usually nearly identical, but subtracting two of these numbers does not give an answer of zero.

In most cases, the slight errors are unimportant, but it is important to guard for signs of unreasonable results at many stages during the time domain simulation of the RC network. In particular, given an RC network with all nodes initialized to zero volts, and with a step function applied at some point in the network, it is not possible for any node to drop below zero volts or for any node to exceed $V_{dd}$, the step function voltage.

Figure 5:
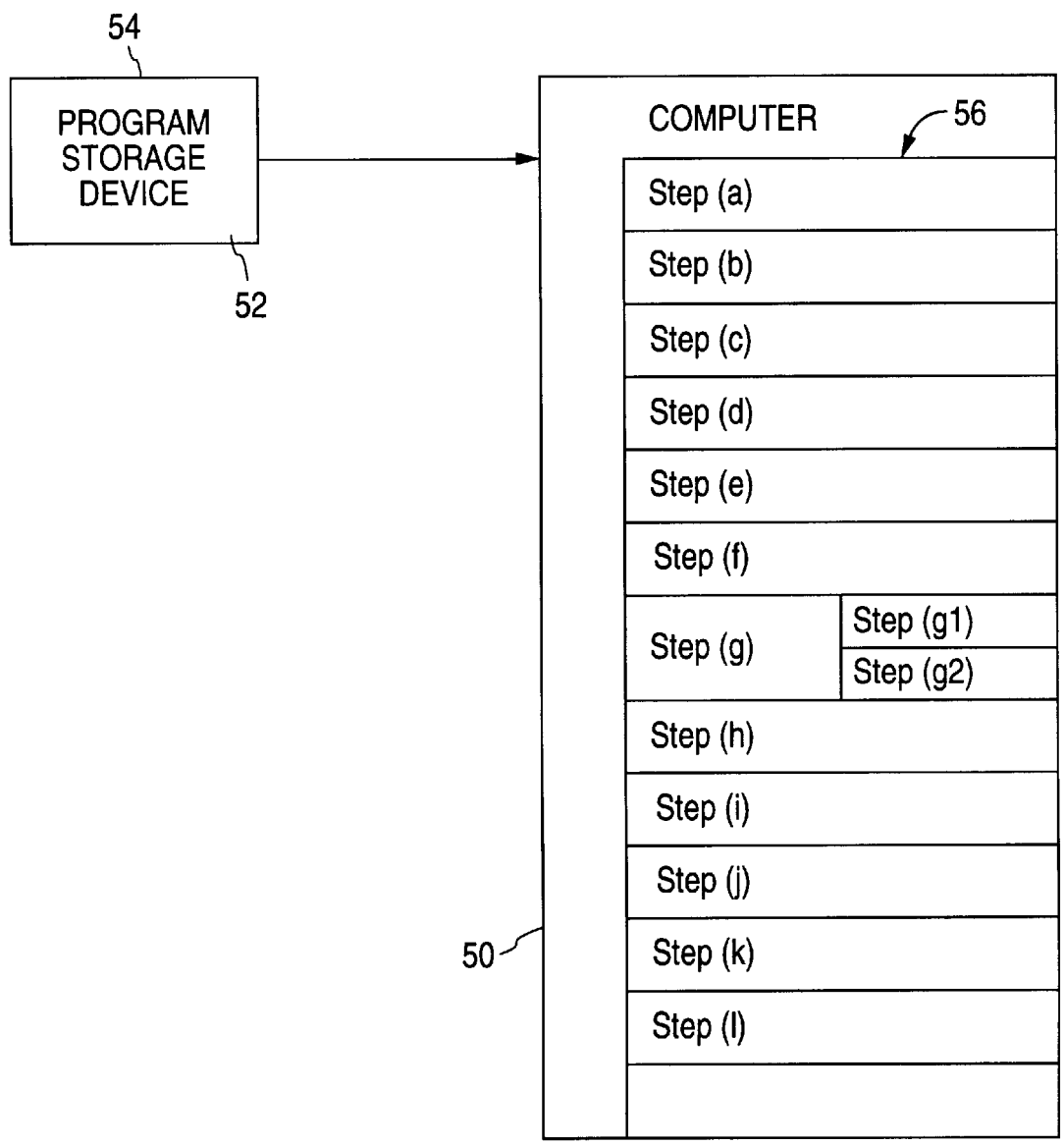
FIG. 5 represents the storage of a computer program and the execution of such program within a computer for performing modeling and analysis in accordance with the present invention.

Referring to FIG. 5, based upon the foregoing discussion, it will be understood to one skilled in the art that the present invention is intended to be practiced through the use of a computer 50. The program 52 for performing the above-discussed analysis technique can be stored in a program storage device (many forms of which are well known in the art) 54. As the program 52 is loaded into and executed by the computer 50, the basic program steps 56 are preferably executed as follows:

(a) mapping a plurality of interconnected cooperative logic functions into a programmable design for a programmable integrated circuit, wherein the programmable design includes a plurality of signal interconnection lines which programmably interconnect a plurality of electronic circuits within the programmable integrated circuit;

(b) generating a plurality of signal interconnection line data which represent the plurality of signal interconnection lines;

(c) mapping the plurality of signal interconnection line data into a distributed electrical circuit model which includes a plurality of impedance elements interconnected only as a plurality of serial resistive and shunt capacitive elements via a plurality of circuit model nodes;

(d) generating a plurality of load data which represent corresponding ones of the plurality of electronic circuits;

(e) mapping the plurality of load data into a corresponding plurality of load models;

(f) incorporating the plurality of load models into the distributed electrical circuit model as a plurality of additional shunt impedance elements which are connected to respective ones of the plurality of circuit model nodes;

(g) generating a plurality of nodal equations which define, in terms of a finite time interval, a corresponding plurality of relationships among a plurality of electrical currents which, due to the interconnected pluralities of serial resistive and shunt capacitive elements, flow into and out of corresponding ones of the plurality of circuit model nodes;

(h) manipulating a plurality of common variables within the plurality of nodal equations and in accordance therewith generating a plurality of simplified nodal equations which can be collectively represented in a matrix format which includes a square quasi-diagonal coefficient matrix in which all elements more than one element away from a major diagonal thereof have a zero value; and (i) solving the plurality of simplified nodal equations and in accordance therewith computing a plurality of signal propagation delays along the plurality of signal interconnection lines. Preferably, step (g) itself includes the following:

(g1) generating a plurality of differential nodal equations which define the corresponding plurality of relationships among the plurality of electrical currents which, due to the interconnected pluralities of serial resistive and shunt capacitive elements, flow into and out of the corresponding ones of the plurality of circuit model nodes; and (g2) converting the plurality of differential nodal equations to a corresponding plurality of linear nodal equations which define the corresponding plurality of relationships among the plurality of electrical currents which, due to the interconnected pluralities of serial resistive and shunt capacitive elements, flow into and out of the corresponding ones of the plurality of circuit model nodes in the terms of the finite time interval.

Further steps of the program 52 can include the following:

(j) comparing the computed plurality of signal propagation delays to a corresponding plurality of desired signal propagation delays;

(k) selectively mapping the plurality of interconnected cooperative logic functions into an additional programmable design for the programmable integrated circuit, wherein the additional programmable design includes another plurality of signal interconnection lines which programmably interconnect the plurality of electronic circuits within the programmable integrated circuit; and (l) repeating the steps of (b), (c), (d), (e), (f), (g), (h) and (i).

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A computer-implemented process for analyzing a plurality of signal propagation delays along a plurality of signal interconnection lines within a programmable integrated circuit as part of the design of such programmable integrated circuit, comprising the computer-implemented steps of:

(a) mapping a plurality of interconnected cooperative logic functions into a programmable design for a programmable integrated circuit, wherein said programmable design includes a plurality of signal interconnection lines which programmably interconnect a plurality of electronic circuits within said programmable integrated circuit;

(b) generating a plurality of signal interconnection line data which represent said plurality of signal interconnection lines;

(c) mapping said plurality of signal interconnection line data into a distributed electrical circuit model which includes a plurality of impedance elements interconnected only as a plurality of serial resistive and shunt capacitive elements via a plurality of circuit model nodes;

(d) generating a plurality of load data which represent corresponding ones of said plurality of electronic circuits;

(e) mapping said plurality of load data into a corresponding plurality of load models;

(f) incorporating said plurality of load models into said distributed electrical circuit model as a plurality of additional shunt impedance elements which are connected to respective ones of said plurality of circuit model nodes;

(g) generating a plurality of nodal equations which define, in terms of a finite time interval, a corresponding plurality of relationships among a plurality of electrical currents which, due to said interconnected pluralities of serial resistive and shunt capacitive elements, flow into and out of corresponding ones of said plurality of circuit model nodes;

(h) manipulating a plurality of common variables within said plurality of nodal equations and in accordance therewith generating a plurality of simplified nodal equations which can be collectively represented in a matrix format which includes a square quasi-diagonal coefficient matrix in which all elements more than one element away from a major diagonal thereof have a zero value; and (i) solving said plurality of simplified nodal equations and in accordance therewith computing a plurality of signal propagation delays along said plurality of signal interconnection lines.

2. The method of claim 1, wherein said step of generating a plurality of nodal equations which define, in terms of a finite time interval, a corresponding plurality of relationships among a plurality of electrical currents which, due to said interconnected pluralities of serial resistive and shunt capacitive elements, flow into and out of corresponding ones of said plurality of circuit model nodes comprises:

generating a plurality of differential nodal equations which define said corresponding plurality of relationships among said plurality of electrical currents which, due to said interconnected pluralities of serial resistive and shunt capacitive elements, flow into and out of said corresponding ones of said plurality of circuit model nodes; and converting said plurality of differential nodal equations to a corresponding plurality of linear nodal equations which define said corresponding plurality of relationships among said plurality of electrical currents which, due to said interconnected pluralities of serial resistive and shunt capacitive elements, flow into and out of said corresponding ones of said plurality of circuit model nodes in said terms of said finite time interval.

3. The method of claim 1, further comprising the steps of:

comparing said computed plurality of signal propagation delays to a corresponding plurality of desired signal propagation delays;

selectively mapping said plurality of interconnected cooperative logic functions into another programmable design for said programmable integrated circuit, wherein said another programmable design includes another plurality of signal interconnection lines which programmably interconnect said plurality of electronic circuits within said programmable integrated circuit; and repeating said steps (b), (c), (d), (e), (f), (g), (h) and (i).

4. A program storage device which is readable by a machine and tangibly embodies a program of instructions which are executable by said machine to perform method steps for analyzing a plurality of signal propagation delays along a plurality of signal interconnection lines within a programmable integrated circuit as part of the design of such programmable integrated circuit, said machine-implemented method steps comprising:

(a) mapping a plurality of interconnected cooperative logic functions into a programmable design for a programmable integrated circuit, wherein said programmable design includes a plurality of signal interconnection lines which programmably interconnect a plurality of electronic circuits within said programmable integrated circuit;

(b) generating a plurality of signal interconnection line data which represent said plurality of signal interconnection lines;

(c) mapping said plurality of signal interconnection line data into a distributed electrical circuit model which includes a plurality of impedance elements interconnected only as a plurality of serial resistive and shunt capacitive elements via a plurality of circuit model nodes;

(d) generating a plurality of load data which represent corresponding ones of said plurality of electronic circuits;

(e) mapping said plurality of load data into a corresponding plurality of load models;

(f) incorporating said plurality of load models into said distributed electrical circuit model as a plurality of additional shunt impedance elements which are connected to respective ones of said plurality of circuit model nodes;

(g) generating a plurality of nodal equations which define, in terms of a finite time interval, a corresponding plurality of relationships among a plurality of electrical currents which, due to said interconnected pluralities of serial resistive and shunt capacitive elements, flow into and out of corresponding ones of said plurality of circuit model nodes;

(h) manipulating a plurality of common variables within said plurality of nodal equations and in accordance therewith generating a plurality of simplified nodal equations which can be collectively represented in a matrix format which includes a square quasi-diagonal coefficient matrix in which all elements more than one element away from a major diagonal thereof have a zero value; and (i) solving said plurality of simplified nodal equations and in accordance therewith computing a plurality of signal propagation delays along said plurality of signal interconnection lines.

5. The program storage device of claim 4, wherein said step of generating a plurality of nodal equations which define, in terms of a finite time interval, a corresponding plurality of relationships among a plurality of electrical currents which, due to said interconnected pluralities of serial resistive and shunt capacitive elements, flow into and out of corresponding ones of said plurality of circuit model nodes comprises:

generating a plurality of differential nodal equations which define said corresponding plurality of relationships among said plurality of electrical currents which, due to said interconnected pluralities of serial resistive and shunt capacitive elements, flow into and out of said corresponding ones of said plurality of circuit model nodes; and converting said plurality of differential nodal equations to a corresponding plurality of linear nodal equations which define said corresponding plurality of relationships among said plurality of electrical currents which, due to said interconnected pluralities of serial resistive and shunt capacitive elements, flow into and out of said corresponding ones of said plurality of circuit model nodes in said terms of said finite time interval.

6. The program storage device of claim 4, wherein said method steps further comprise:

comparing said computed plurality of signal propagation delays to a corresponding plurality of desired signal propagation delays;

selectively mapping said plurality of interconnected cooperative logic functions into another programmable design for said programmable integrated circuit, wherein said another programmable design includes another plurality of signal interconnection lines which programmably interconnect said plurality of electronic circuits within said programmable integrated circuit; and repeating said steps (b), (c), (d), (e), (f), (g), (h) and (i).

7. A computer programmed to analyze a plurality of signal propagation delays along a plurality of signal interconnection lines within a programmable integrated circuit as part of the design of such programmable integrated circuit by performing the computer-implemented steps of:

(a) mapping a plurality of interconnected cooperative logic functions into a programmable design for a programmable integrated circuit, wherein said programmable design includes a plurality of signal interconnection lines which programmably interconnect a plurality of electronic circuits within said programmable integrated circuit;

(b) generating a plurality of signal interconnection line data which represent said plurality of signal interconnection lines;

(c) mapping said plurality of signal interconnection line data into a distributed electrical circuit model which includes a plurality of impedance elements interconnected only as a plurality of serial resistive and shunt capacitive elements via a plurality of circuit model nodes;

(d) generating a plurality of load data which represent corresponding ones of said plurality of electronic circuits;

(e) mapping said plurality of load data into a corresponding plurality of load models;

(f) incorporating said plurality of load models into said distributed electrical circuit model as a plurality of additional shunt impedance elements which are connected to respective ones of said plurality of circuit model nodes;

(g) generating a plurality of nodal equations which define, in terms of a finite time interval, a corresponding plurality of relationships among a plurality of electrical currents which, due to said interconnected pluralities of serial resistive and shunt capacitive elements, flow into and out of corresponding ones of said plurality of circuit model nodes;

(h) manipulating a plurality of common variables within said plurality of nodal equations and in accordance therewith generating a plurality of simplified nodal equations which can be collectively represented in a matrix format which includes a square quasi-diagonal coefficient matrix in which all elements more than one element away from a major diagonal thereof have a zero value; and (i) solving said plurality of simplified nodal equations and in accordance therewith computing a plurality of signal propagation delays along said plurality of signal interconnection lines.

8. The computer of claim 7, wherein said computer is programmed to perform said step of generating a plurality of nodal equations which define, in terms of a finite time interval, a corresponding plurality of relationships among a plurality of electrical currents which, due to said interconnected pluralities of serial resistive and shunt capacitive elements, flow into and out of corresponding ones of said plurality of circuit model nodes by performing the steps of:

generating a plurality of differential nodal equations which define said corresponding plurality of relationships among said plurality of electrical currents which, due to said interconnected pluralities of serial resistive and shunt capacitive elements, flow into and out of said corresponding ones of said plurality of circuit model nodes; and converting said plurality of differential nodal equations to a corresponding plurality of linear nodal equations which define said corresponding plurality of relationships among said plurality of electrical currents which, due to said interconnected pluralities of serial resistive and shunt capacitive elements, flow into and out of said corresponding ones of said plurality of circuit model nodes in said terms of said finite time interval.

9. The computer of claim 7, wherein said computer is further programmed to perform the steps of:

comparing said computed plurality of signal propagation delays to a corresponding plurality of desired signal propagation delays;

selectively mapping said plurality of interconnected cooperative logic functions into another programmable design for said programmable integrated circuit, wherein said another programmable design includes another plurality of signal interconnection lines which programmably interconnect said plurality of electronic circuits within said programmable integrated circuit; and repeating said steps e), (c), (d), (e), (f), (g), (h) and (i).

\* \* \* \* \*